May 7, 1968 W. T. TURNER 3,382,440

APPARATUS FOR AUTOMATICALLY CONVERTING A RADIO RECEIVER TO AN FM OR VHF RECEIVER

Filed Oct. 10, 1966

INVENTOR.
WILLIAM T. TURNER

BY Fulwider, Patton, Rieber, Lee and Utecht
ATTORNEYS

United States Patent Office 3,382,440

Patented May 7, 1968

3,382,440

APPARATUS FOR AUTOMATICALLY CONVERTING A RADIO RECEIVER TO AN FM OR VHF RECEIVER

William T. Turner, 3027 Rutger Ave., Long Beach, Calif. 90808

Filed Oct. 10, 1966, Ser. No. 585,562
3 Claims. (Cl. 325—317)

ABSTRACT OF THE DISCLOSURE

A radio receiver having a detector including circuitry for converting such detector to either an AM or FM detector. A switch for controlling the AM to FM conversion is included in the circuitry and is mechanically coupled with the frequency control knob whereby the detector is automatically converted to an AM or FM detector when the radio is tuned to AM or FM frequencies, respectively.

The present invention relates to improvements in radio receivers and, more particularly, to novel apparatus for automatically converting a radio receiver to either an FM or VHF receiver.

Broadband radio receivers for receiving both frequency and amplitude modulated signals generally include separate frequency and amplitude modulation detectors and associated circuitry for handling the differently-modulated signals, be they relatively low frequency AM, FM, or VHF, amplitude modulated, signals. Such radio receivers also include manual switch units for energizing the separate detector circuitry when it is desired to receive frequency or amplitude modulated signal information.

Although such arrangements result in satisfactory radio reception, the duplication of detector and associated circuitry is expensive and the required manual switching is annoying and time-consuming.

Accordingly, it is a general object of the present invention to provide simple, inexpensive, and reliable apparatus for rapidly and automatically converting a radio receiver from an FM receiver to a VHF receiver and back using substantially the same detector circuitry in both modes of receiver operation.

Another object of the present invention is to provide apparatus of the foregoing character including means for automatically converting the detector of the radio receiver to either an AM or FM detector as the receiver is tuned to receive electrical signals in bands requiring either amplitude or frequency demodulation.

Still another object of the present invention is to provide apparatus of the foregoing character further including a switch which in one state converts the detector to an AM detector, and means operated by the control knob which controls the tuning of the receiver for automatically changing the state of the switch as the receiver is tuned to receive electrical signals requiring different types of demodulation.

The foregoing, as well as other objects and advantages of the present invention may be more clearly understood by reference to the following detailed description when considered with the drawing, which by way of example only, illustrates one form of converter apparatus embodying the features of the present invention.

Figures 1, 2, 3:
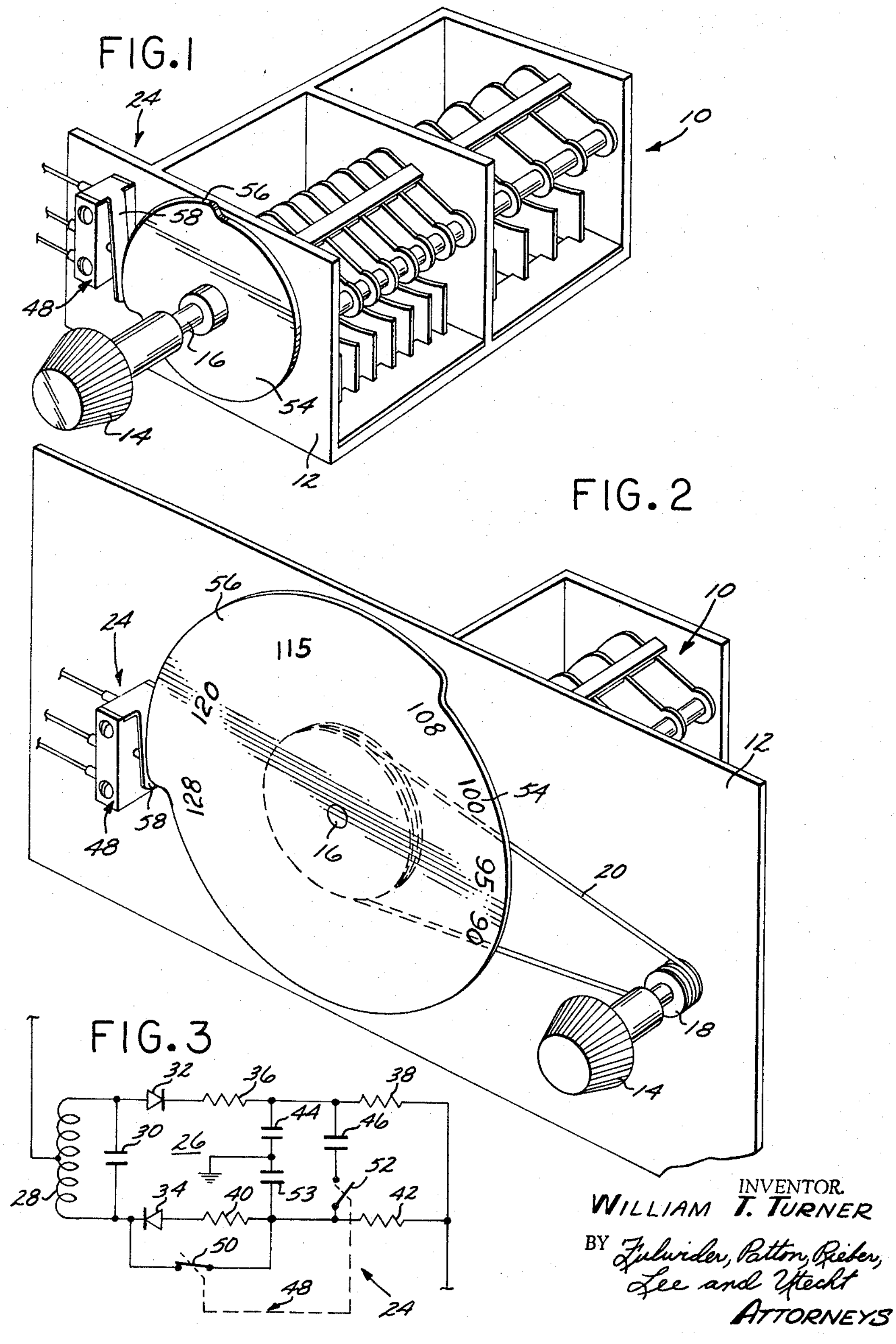
FIGURE 1 is a perspective view of the tuning capacitor unit in a radio receiver and associated control knob together with switching apparatus for automatically converting the associated radio receiver to either a FM or VHF radio receiver.
FIGURE 2 is a perspective view similar to FIGURE 1 illustrating an alternate form of control for the tuning capacitor unit.
FIGURE 3 is a wiring diagram of a detector which, by operation of the switch unit illustrated in FIGURES 1 and 2, is converted to either an AM or FM detector.

As is commonly known, amplitude modulated and frequency modulated electrical signals are transmitted in different frequency bands. For example, frequency modulated signals are transmitted over a band of about 90 to 108 megacycles, while amplitude modulated signals are transmitted in the VHF band from 108 to about 128 megacycles. Despite the adjacent nature of the FM and VHF bands, radio receivers for receiving such signals generally utilize separate detector circuits and manual switch units for controlling the radio receiver to receive either FM signals or AM signals in the VHF band.

Generally speaking, in the present invention, a radio receiver for receiving signals in the FM and VHF bands is rapidly and automatically converted from an FM receiver to an AM receiver as the receiver is tuned from the FM to the VHF band and is automatically converted from an AM to an FM receiver as the receiver is tuned from the VHF to the FM band. Moreover, during both modes of operation, major portions of the same detector circuitry are employed.

More particularly, FIGURES 1 and 2 of the drawing illustrate a tuning capacitor unit 10 for tuning an associated radio receiver (not shown) to receive electrical signals in the FM and VHF bands. The tuning capacitor 10 is of conventional design and is mounted behind a vertical panel 12 in the radio receiver. In FIGURE 1, a tuning knob 14 is connected directly to the shaft 16 for turning the movable plates of the capacitor unit while in FIGURE 2 the control knob is connected to the panel 12 and carries a small pulley 18. A belt 20 extends around the pulley 18 and around a large pulley on the shaft 16. In both forms, a turning of the control knob 14 produces a similar rotation of the shaft 16 to control the tuning capacitor unit 10 and hence tune the associated radio receiver to receive electrical signals in either the FM or the VHF band.

As the capacitor unit 10 tunes the receiver from the FM to the VHF band, converter apparatus 24 rapidly and automatically converts the receiver from an FM to an AM receiver. Similarly, as the receiver is tuned from the VHF to the FM band, the converter apparatus 24 automatically converts the receiver from an AM to an FM receiver.

Generally speaking, the converter apparatus 24 operates upon the detector in the radio receiver to automatically convert the detector from an AM to an FM detector and back as the receiver is tuned from and to the VHF band. By way of example only, the detector may be of the form illustrated in FIGURE 3 and represented generally by the numeral 26. As illustrated, the detector 26 includes the secondary winding 28 of a transformer. A capacitor 30 is connected across the secondary winding 28 while diodes 32 and 34 are connected to opposite junctions of the secondary winding and the capacitor. In this regard, the anode of the diode 32 is connected to one junction while the cathode of the diode 34 is connected to the other junction. Resistors 36 and 38 are connected in series with the diode 32 and to the output of the detector while resistors 40 and 42 are connected in series with the diode 34 and the output. Capacitors 44 and 46 are connected to the junction of the resistors 36 and 38. The capacitor 44 is connected to a reference ground while the capacitor 46 is adapted for connection to a junction of the resistors 40 and 42. The elements described thus far define a conventional FM detector commonly referred to as a "ratio" detector.

The converter apparatus 24 of the present invention includes means for automatically converting the detector 26 to an AM detector when the associated receiver is tuned from the FM to the VHF band. In this regard, the illustrated form of the converter apparatus includes a capacitor 53 and a double throw-single pole switch 48 including two switch arms 50 and 52. The switch arm 50 is connected to a junction of the capacitor 30 and the diode 34 in series with the capacitor 53. The capacitor 53, in turn, is connected to the reference ground. The switch arm 52 is connected in series with the capacitor 46 and to a junction of the resistors 40 and 42.

FIGURE 3 illustrates the switch 48 in an actuated condition with the switch arm 50 closed and the switch arm 52 open. Thus, in the actuated condition, the converter apparatus 24 converts the detector 26 to an AM detector of conventional form. Conversely, when the switch 48 is in its normal state, the switch arm 50 is open and the switch arm 52 is closed to convert the detector 26 back to an FM detector.

As previously discussed, the converter apparatus 24 is arranged to convert the receiver to an FM receiver when the receiver is tuned to an FM band and to convert the receiver to an AM receiver when the receiver is tuned to a VHF band. To accomplish this, the illustrated form of the converter apparatus further includes a disc 54 connected to the shaft 16 for turning therewith. The disc 54 carries a radially-extending, arcuate cam 56 for engaging the switch-actuating arm 58 of the switch 48. The cam 56 is oriented relative to the shaft 16 such that it engages the switch-actuating arm 58 as the receiver is being tuned from the FM band to the VHF band and continues in contact with the actuating arm while the receiver is operating the VHF band.

Accordingly, it is appreciated that the converter apparatus 24 rapidly and automatically converts the associated receiver to an AM receiver when the receiver is tuned to the VHF band and converts the receiver to an FM receiver when the receiver is tuned to an FM band. The converter apparatus 24 also enables a major portion of the detector circuitry to be utilized in both modes of radio receiver operation.

While a particular form of converter apparatus has been described in some detail herein, changes and modifications may be made in the illustrated form without departing from the spirit of the present invention. Furthermore, although the converter apparatus has been described as being particularly useful in converting a radio receiver to an FM or a VHF receiver, the converter apparatus may be usefully employed in other types of radio receivers for receiving amplitude and frequency modulated signals. Accordingly, it is intended that the present invention be limited in scope only by the terms of the following claims.

I claim:

1. In a radio receiver:

a detector for demodulating electrical signals received by said receiver;

circuit means connected to said detector for converting said detector to either an FM detector or an AM detector, said circuit means including switch means having first and second states and being arranged in said circuit means such that said detector is an FM detector when said switch means is in said first state and said detector is an AM detector when said switch means is in said second state;

a tuning capacitor for tuning said receiver to receive electrical signals of particular frequencies;

a turnable control knob for manually controlling said tuning capacitor to tune said receiver to receive electrical signals of different predetermined frequencies; and mechanical means coupled with said control knob for automatically actuating said switch means to change between said first and second states and to thereby convert said detector to either an AM detector or an FM detector as said knob is rotated to adjust said tuning capacitor to tune said receiver to receive electrical signals in frequency bands requiring amplitude or frequency demodulation respectively, whereby said receiver may be automatically converted to be an FM or VHF receiver.

2. The combination of claim 1 wherein said switch means is a mechanical switch and wherein said means for actuating said switch means includes cam means controlled by turning of said control knob to engage and disengage said switch and to thereby change said switch means between said first and second states.

3. The combination of claim 2 wherein said cam means is an arcuate cam mounted for turning with said control knob to engage and disengage said switch as said knob turns to tune said receiver to receive electrical signals requiring different types of demodulation.

References Cited

UNITED STATES PATENTS

| | | | |
|---|---|---|---|
| 2,422,087 | 6/1947 | Everett | 325—317 XR |
| 2,561,088 | 7/1951 | Anderson | 325—317 XR |
| 2,798,152 | 7/1957 | Janssen | 325—315 |
| 3,172,040 | 3/1965 | Schultz | 325—316 |

KATHLEEN H. CLAFFY, *Primary Examiner.*

R. S. BELL, *Assistant Examiner.*